(12) United States Patent
Kim et al.

(10) Patent No.: US 12,541,144 B2
(45) Date of Patent: Feb. 3, 2026

(54) PHASE SHIFT BLANKMASK AND PHOTOMASK FOR EUV LITHOGRAPHY

(71) Applicant: S&S TECH Co., Ltd., Daegu-si (KR)

(72) Inventors: Yong-Dae Kim, Daegu (KR);
Jong-Hwa Lee, Daegu (KR);
Chul-Kyu Yang, Daegu (KR)

(73) Assignee: S&S TECH Co., Ltd., Daegu-si (KR)

(*) Notice: Subject to any disclaimer, the term of this patent is extended or adjusted under 35 U.S.C. 154(b) by 519 days.

(21) Appl. No.: 17/989,425

(22) Filed: Nov. 17, 2022

(65) Prior Publication Data
US 2024/0126162 A1   Apr. 18, 2024

(30) Foreign Application Priority Data
Oct. 13, 2022  (KR) .................. 10-2022-0131243

(51) Int. Cl.
*G03F 1/26* (2012.01)
*G03F 1/24* (2012.01)

(52) U.S. Cl.
CPC . *G03F 1/26* (2013.01); *G03F 1/24* (2013.01)

(58) Field of Classification Search
CPC .................................... G03F 1/26; G03F 1/24
USPC ........................................................... 430/5
See application file for complete search history.

(56) References Cited

U.S. PATENT DOCUMENTS

| | | | |
|---|---|---|---|
| 2012/0107733 A1* | 5/2012 | Hayashi ............... | B82Y 40/00 430/5 |
| 2016/0054650 A1* | 2/2016 | Nam ..................... | G03F 1/26 430/5 |
| 2018/0335692 A1* | 11/2018 | Nam ..................... | G03F 1/60 |
| 2019/0079383 A1* | 3/2019 | Ikebe ................... | G03F 1/32 |
| 2020/0057363 A1 | 2/2020 | Hsu et al. | |
| 2021/0255536 A1* | 8/2021 | Ikebe ................... | G03F 1/26 |
| 2021/0325772 A1* | 10/2021 | Kawahara ............ | G03F 1/54 |
| 2022/0128898 A1 | 4/2022 | Maeda et al. | |
| 2022/0179300 A1 | 6/2022 | Shishido et al. | |
| 2022/0236635 A1 | 7/2022 | Shin et al. | |
| 2022/0269160 A1* | 8/2022 | Kim ..................... | G03F 1/26 |
| 2022/0283488 A1 | 9/2022 | Park et al. | |
| 2022/0390826 A1 | 12/2022 | Ikebe et al. | |

FOREIGN PATENT DOCUMENTS

| | | |
|---|---|---|
| JP | 2017191344 A | 10/2017 |
| JP | 2022115074 A | 8/2022 |
| JP | 2022130293 A | 9/2022 |
| KR | 1020180129838 A | 12/2018 |
| KR | 1020210121067 A | 10/2021 |
| KR | 1020210147313 A | 12/2021 |
| KR | 1020220103924 A | 7/2022 |

(Continued)

Primary Examiner — Caleen O Sullivan
(74) Attorney, Agent, or Firm — WILLIAM PARK AND ASSOCIATES LTD.

(57) ABSTRACT

Disclosed is a blankmask for EUV lithography, including a reflective film, a capping film and a phase shift film which are sequentially formed on a substrate. The phase shift film includes a first layer containing niobium (Nb) and chrome (Cr), and a second layer containing tantalum (Ta) and silicon (Si). In the first layer, the content of niobium (Nb) ranges from 20 to 50 at %, and the content of chrome (Cr) content ranges from 10 to 40 at %. The blankmask can implement an excellent resolution and NILS, and implement a low DtC.

11 Claims, 3 Drawing Sheets

(56) References Cited

FOREIGN PATENT DOCUMENTS

| KR | 1020220121399 A | 9/2022 |
| TW | 201122721 A | 7/2011 |
| TW | 202020552 A | 6/2020 |
| TW | 202105039 A | 2/2021 |
| TW | 202238253 A | 10/2022 |

\* cited by examiner

PHASE SHIFT BLANKMASK AND PHOTOMASK FOR EUV LITHOGRAPHY

CROSS-REFERENCE TO RELATED THE APPLICATION

This application is based on and claims priority under 35 U.S.C. § 119(a) to Korean Patent Application No. 10-2022-0131243, filed on Oct. 13, 2022 in the Korean Intellectual Property Office, the disclosure of which is incorporated by reference herein in its entirety.

BACKGROUND

Field

The disclosure relates to a blankmask and a photomask, and more particularly to a phase shift blankmask, which includes a phase shift film for shifting a phase with respect to extreme ultraviolet (EUV) light to implement high resolution during wafer printing, and a photomask prepared using the same for EUV lithography.

Description of the Related Art

Technology of lithography for a semiconductor has recently developed from ArF, ArFi multiple (MP) lithography to extreme ultraviolet (EUV) Lithography. A blankmask used for the EUV lithography generally includes two thin films on a substrate, such as a reflective film for reflecting EUV light and an absorption film for absorbing the EUV light.

Recently, attempts have been made to develop a phase shift blankmask capable of implementing a higher resolution than such a binary blankmask having the absorption film. The phase shift blankmask has a higher normalized image log slope (NILS) than the binary blankmask, and thus reduces a stochastic defect due to a shot noise effect during wafer printing. Further, the phase shift blankmask implements low dose to clear (DtC), thereby increasing semiconductor productivity.

FIG. 1 is a view showing a basic structure of a phase shift blankmask for the EUV lithography. The phase shift blankmask for the EUV lithography includes a substrate 102, a reflective film 104 formed on the substrate 102, a capping film 105 formed on the reflective film 104, a phase shift film 108 formed on the capping film 105, and a resist film 110 formed on the phase shift film 108.

In the phase shift blankmask for the EUV lithography, it is preferable that the phase shift film 108 is made of a material that is easy to prepare a photomask and has good performance during wafer printing. In this regard, ruthenium (Ru) has been researched as the material of the phase shift film 108, but has not reached a production stage due to problems as follows.

First, ruthenium (Ru) has a slow etch rate and thus makes it difficult to implement a vertical pattern profile while the phase shift film 108 is etched.

Second, the capping film 105 beneath the phase shift film 108 is generally made of ruthenium (Ru), and it is difficult to secure etch selectivity to the capping film 105 when the phase shift film 108 contains ruthenium (Ru) like the capping film 105. Therefore, when ruthenium (Ru) is used for both the capping film 105 and the phase shift film 108, an etch stop film is additionally needed between the phase shift film 108 and the capping film 105, thereby causing problems of increasing the complexity of thin film design, adding a process of forming the etch stop film, and requiring cleaning and defect control for the additional thin film, etc. Besides, the cleaning and the like additional process are required even for a photomask prepared using this blankmask. Such problems eventually act as a cause of decreasing yield.

Third, ruthenium (Ru) has high surface reflectivity to deep ultraviolet (DUV) inspection light having a wavelength of 193 nm, and thus causes a problem of lowering inspection sensitivity during inspection using the DUV inspection light. To solve this problem, oxygen (O) may be additionally used together with ruthenium (Ru). However, when oxygen (O) and ruthenium (Ru) are used together, a problem of increasing a refractive index (n) occurs. Further, oxygen (O) oxidizes the capping film 105 made of ruthenium (Ru), thereby decreasing the reflectivity of a structure where the reflective film 104 and the capping film 105 are stacked.

Fourth, ruthenium (Ru) has a slow repair speed due to resistance to $XeF_2$ during e-beam repair, thereby causing a problem of a bad pattern immediately after repair.

SUMMARY

An aspect of the disclosure is to provide a blankmask for extreme ultraviolet (EUV), which can solve the problems caused by a material conventionally used as a phase shift film, in particular, ruthenium (Ru), while satisfying characteristics required for the phase shift film.

According to an embodiment of the disclosure, there is provided a blankmask for extreme ultraviolet (EUV) lithography, including a substrate, a reflective film formed on the substrate, a capping film formed on the reflective film, and a phase shift film formed on the capping film, the phase shift film including: a first layer formed on the capping film and containing niobium (Nb), and a second layer formed on the first layer and containing one or more of tantalum (Ta) and silicon (Si).

The first layer may contain one or more of tantalum (Ta) and silicon (Si).

The first layer may further contain chrome (Cr).

The content of chrome (Cr) in the first layer may range from 10 to 40 at %.

The first layer may further contain one or more of oxygen (O), nitrogen (N), and carbon (C).

The content of nitrogen (N) in the first layer may range from 10 to 60 at %.

The first layer may have a thickness of 30 to 60 nm.

The first layer may have a thickness of 80% or more of a total thickness of the phase shift film.

The first layer may have a refractive index (n) of 0.925 to 0.935 and an extinction coefficient (k) of 0.015 to 0.025 with respect to exposure light having a wavelength of 13.5 nm.

The content of tantalum (Ta) in the second layer may be higher than or equal to 50 at %.

The second layer may contain one or more of oxygen (O), nitrogen (N), and carbon (C).

The second layer may further contain boron (B).

The content of boron (B) in the second layer may range from 5 to 20 at %.

The second layer may have a thickness of 2 to 10 nm.

The second layer may have a surface reflectivity of 40% or lower to inspection light having a wavelength of 193 nm.

The second layer may have a refractive index (n) of 0.940 to 0.960 and an extinction coefficient (k) of 0.025 to 0.035 with respect to exposure light having a wavelength of 13.5 nm.

The phase shift film may have a relative reflectivity of 6 to 15% to the reflective film with respect to exposure light having a wavelength of 13.5 nm.

According to another embodiment of the disclosure, there is provided a photomask prepared using the foregoing blankmask for extreme ultraviolet (EUV) lithography.

BRIEF DESCRIPTION OF THE DRAWINGS

The above and/or the aspects will become apparent and more readily appreciated from the following description of exemplary embodiments, taken in conjunction with the accompanying drawings, in which.

DETAILED DESCRIPTION OF EXEMPLARY EMBODIMENTS

Below, the disclosure will be described in more detail with reference to the accompanying drawings.

Figure 1:
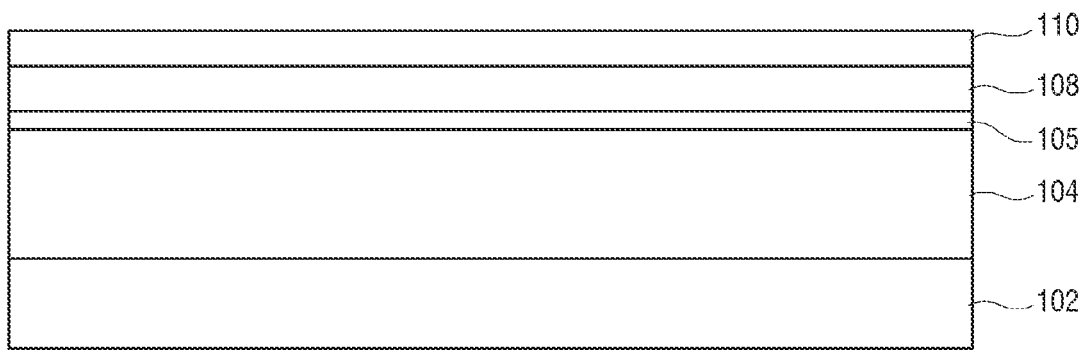
FIG. 1 is a view showing a basic structure of a conventional phase shift blankmask for extreme ultraviolet (EUV) lithography.
Figure 2:
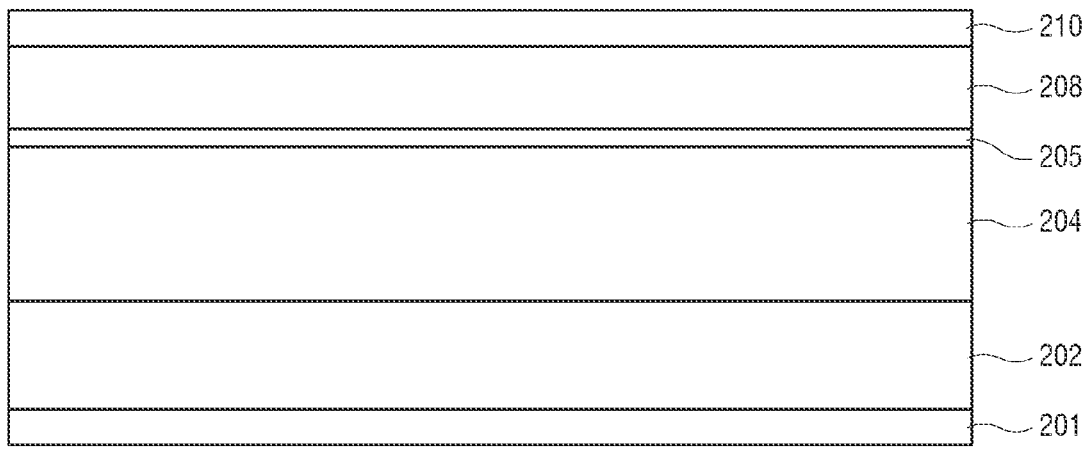
FIG. 2 is a view showing a phase shift blankmask for extreme ultraviolet (EUV) lithography according to the disclosure.
Figure 3:
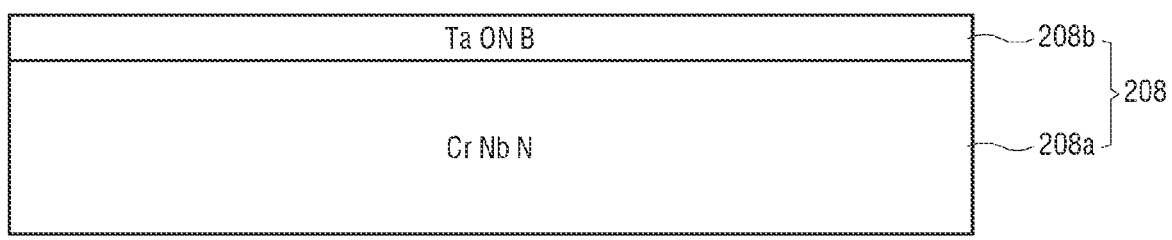
FIG. 3 is a view showing a detailed configuration of the phase shift film of FIG. 2.

FIG. 2 is a view showing a phase shift blankmask for extreme ultraviolet (EUV) lithography according to the disclosure, and FIG. 3 is a view showing a detailed configuration of the phase shift film of FIG. 2.

The phase shift blankmask for the EUV lithography according to the disclosure includes a substrate 202, a reflective film 204 formed on the substrate 202, a capping film 205 formed on the reflective film 204, a phase shift film 208 formed on the capping film 205, a resist film 210 formed on the phase shift film 208, and a conductive film 201 formed on the rear surface of the substrate 202.

The substrate 202 is configured as a low thermal expansion material (LTEM) substrate that has a low thermal expansion coefficient within a range of $0\pm1.0\times10^{-7}/°$ C., preferably, $0\pm0.3\times10^{-7}/°$ C. to prevent deformation and stress of a pattern due to heat during exposure so as to be suitable for a glass substrate for a reflective blank mask using EUV exposure light. As a material of the substrate 202, $SiO_2$—$TiO_2$ based glass, multicomponent glass-ceramic, etc. may be used.

The reflective film 204 has a multilayered structure in which layers are different in the refractive index, and functions to reflect the EUV exposure light. Specifically, the reflective film 204 is formed of 40 to 60 layers by alternately stacking an Mo layer and a Si layer.

The capping film 205 serves to prevent an oxide film from being formed on the reflective film 204 in order to maintain the reflectivity of the reflective film 204 to the EUV exposure light, and prevent the reflective film 204 from being etched while the phase shift film 208 is patterned. In general, the capping film 205 is made of a material containing ruthenium (Ru). The capping film 205 is formed to have a thickness of 2 to 5 nm. When the thickness of the capping film 205 is less than or equal to 2 nm, it is difficult to function as the capping film 205. When the thickness of the capping film 205 is more than or equal to 5 nm, the reflectivity to the EV exposure light is lowered.

The phase shift film 208 shifts the phase of the exposure light and reflects the exposure light, thereby destructively interfering with the exposure light reflected from the reflective film 204. The phase shift film 208 includes a first layer 208a formed on the capping film 205, and a second layer 208b formed on the first layer 208a.

The first layer 208a is made of a material containing niobium (Nb). In this case, the content of niobium (Nb) in the first layer 208a may be 20 to 50 at %. When niobium (Nb) is less than 20 at %, an etch rate is significantly lowered, and it is difficult to implement the vertical pattern profile. Further, the refractive index (n) and the extinction coefficient (k) are relatively high, and therefore not only there is a limit to finally improve NILS and DtC but also there are problems of decreasing the reflectivity and increasing the thickness. When niobium (Nb) is more than or equal to 50 at %, chemical resistance to chemicals used in cleaning, e.g., sulfuric acid is decreased.

The first layer 208a is etched by chlorine ($Cl_2$)-based gas, and, in particular, etched under a condition that oxygen ($O_2$) is not contained. Therefore, when the first layer 208a is etched, in particular, over-etched, damage to ruthenium (Ru) contained in the capping film 205 beneath the first layer 208a is reduced, thereby minimizing a problem such as decrease in reflectivity. Accordingly, an additional thin film such as an etch stop film is not needed.

Further, the first layer 208a has a high etch rate with respect to chlorine ($Cl_2$)-based etching gas in which oxygen ($O_2$) is not contained, thereby improving the vertical pattern profile. Further, the first layer 208a is easily repaired with respect to $XeF_2$ during an e-beam repair, and excellent in e-beam repair selectivity with respect to the capping film 205 containing ruthenium (Ru).

The first layer 208a may be made of a material containing one or more among tantalum (Ta), silicon (Si), and chrome (Cr). Preferably, the first layer 208a is made of a material containing niobium (Nb) and chrome (Cr), and, in this case, the content of chrome (Cr) in the first layer 208a is 10 to 40 at %. When the content of chrome (Cr) is less than or equal to 10 at %, chemical resistance to chemicals used in cleaning, e.g., sulfuric acid is decreased. When the content of chrome (Cr) is more than or equal to 40 at %, the etch rate is significantly lowered and it is thus difficult to implement a pattern profile.

The first layer 208a may further contain one or more among oxygen (O), nitrogen (N), and carbon (C). Preferably, the first layer 208a further include nitrogen (N). In this case, the content of nitrogen (N) in the first layer 208a may be 10 to 60 at %. When the content of nitrogen (N) is lower than or equal to 10 at %, the refractive index (n) is relatively high and it is thus difficult to improve the NILS. When the content of nitrogen (N) is more than or equal to 60 at %, a reaction for forming a thin film does not effectively occur, thereby lowering a sputtering efficiency.

The first layer 208a has a thickness of 30 to 60 nm, preferably, a thickness of 45 to 60 nm.

The first layer 208a has a thickness of 50% or more, preferably, 80% or more of the total thickness of the phase shift film 208. As a result, the second layer 208b has a thickness of 50% or less, preferably, 20% or less of the total thickness of the phase shift film 208.

The first layer 208a has a refractive index (n) of 0.925 to 0.935 and an extinction coefficient (k) of 0.015 to 0.025 with respect to the exposure light having a wavelength of 13.5 nm. When the refractive index (n) is greater than or equal to 0.935, it is difficult to significantly improve the NILS and the DtS. Therefore, the lower the refractive index (n), the better. However, it is difficult to have the refractive index (n) lower than or equal to 0.925 due to the properties of the material. When the extinction coefficient (k) is lower than or equal to 0.015, relative reflectivity becomes higher, thereby causing a problem of forming a ghost image pattern. Therefore, the higher the extinction coefficient (k), the better. However, it is difficult to have the extinction coefficient (k) higher than or equal to 0.025 due to the properties of the material.

To improve the pattern profile, the first layer 208a may be formed as a continuous film or a multilayered film in which composition is continuously altered. For example, to increase the etch rate in the depth direction of the first layer 208a, the content of nitrogen (N) may be increased in the depth direction of the first layer 208a, or the content of nitrogen (N) or niobium (Nb) may be increased in a portion of the first layer 208a adjacent to the capping film 205. Thus, footing and the like phenomenon are decreased while forming a pattern, thereby making it possible to form the vertical pattern profile.

To form the first layer 208a, a single sputtering method or a co-sputtering method may be used. When the single sputtering method is used, a sputtering target may have the composition of Nb:Cr=30 to 70 at %: 70 to 30 at %, preferably, Nb:Cr=40 to 60 at %:60 to 40 at %. The co-sputtering method is used, the sputtering may be performed using NbCr, Cr and Nb as targets, and the composition of a thin film may be determined by controlling the power of each sputtering process.

The second layer 208b may be made of a material containing one or more between tantalum (Ta) and silicon (Si). Further, the second layer 208b may further contain one or more among oxygen (O), nitrogen (N), and carbon (C). Preferably, the second layer 208b is made of TaON.

The content of tantalum (Ta) in the second layer 208b is more than or equal to 25 at %, preferably, 50 at %. When the content of tantalum (Ta) is low, it is difficult to secure the etch selectivity to the first layer 208a.

The second layer 208b may further contain boron (B). By adjusting the content of boron (B), it is possible to control the refractive index (n) and extinction coefficient (k) of the second layer 208b. The content of boron (B) in the second layer 208b may be 5 to 20 at %. The second layer 208b is decreased in chemical resistance when the content of boron (B) is more than or equal to 20 at %, and increased in the stress of the thin film and decreased in the etch rate when the content of boron (B) is less than or equal to 5 at %.

The second layer 208b is etched by fluorine (F)-based gas. Therefore, the second layer 208b has the etch selectivity to the underlying first layer 208a. In this case, the second layer 208b may be generally etched under a condition that oxygen (02) is not contained, but may selectively contain oxygen (02).

The second layer 208b has a thickness of 2 to 10 nm, preferably a thickness of not greater than 5 nm.

The surface reflectivity of the second layer 208b to the inspection light having a wavelength of 193 nm may be lower than or equal to 40%, preferably, 35%. Therefore, during the inspection using deep ultraviolet (DUV) inspection light, it is impossible to increase the contrast to the reflective film 204 and the capping film 205.

The second layer 208b has a refractive index (n) of 0.940 to 0.960 and an extinction coefficient (k) of 0.025 to 0.035 with respect to the exposure light having a wavelength of 13.5 nm. To have a refractive index (n) of 0.960 or higher, the content of oxygen (O) needs to increase in the second layer 208b, thereby deteriorating the reproducibility and process stability of the thin film. Further, to have an refractive index (n) of 0.940 or lower, the content of oxygen (O) needs to decrease in the second layer 208b, thereby deteriorating the etch selectivity to the first layer 208a. To have an extinction coefficient (k) of 0.025 or lower or 0.035 or higher, the content of oxygen (O) needs to excessively increase or decrease, thereby causing the problems as described above.

The phase shift film 208 has a relative reflectivity of 6 to 15% to the reflective film 204 with respect to the exposure light having a wavelength of 13.5 nm. Here, the relative reflectivity refers to a ratio of the reflectivity of the phase shift film 208 to the reflectivity of the structure where the reflective film 204 and the capping film 205 are stacked. Further, the phase shift film 208 has a phase shift amount of 180 to 220°, preferably, 185 to 220°.

With this foregoing configuration, the total phase shift amount and reflectivity of the phase shift film 208 are varied depending on the first layer 208a. The second layer 208b is different in etching property from the first layer 208a, and thus the second layer 208b serves as a hard mask for etching the first layer 208a while the phase shift film 208 is patterned. Further, the second layer 208b has a low reflectivity, and it is thus possible to easily perform the inspection using the DUV inspection light after the pattern is finally formed.

The resist film 210 is configured as a chemically amplified resist (CAR). The resist film 210 has a thickness of 40 to 100 nm, preferably, 40 to 80 nm.

The conductive film 201 is formed on the rear of the substrate 202. The conductive film 201 has a low sheet resistance value to improve close contact between an electronic chuck and the blankmask for the EUV lithography and serve to prevent particles from being generated due to friction with the electronic chuck. The conductive film 201 has a sheet resistance of 100Ω/□ or lower, preferably, 50Ω/□ or lower, more preferably, 20Ω/□ or lower. The conductive film 201 may be configured in the form of a single film, a continuous film, or a multilayered film. The conductive film 201 may for example mainly contain chrome (Cr) or tantalum (Ta).

A process of preparing the photomask using the blankmask with the foregoing configuration is as follows.

First, the resist film 210 is patterned, and then the second layer 208a is etched with the fluorine-based gas through the resist film pattern. Then, the resist film pattern is removed, and the pattern of the second layer 208a is used as an etch mask to etch the first layer 208a with the chlorine-based gas. In this case, the second layer 208b is a part of the phase shift film 208, but serves as the hard mask film (hard mask) to the first layer 208a during the etching process.

EMBODIMENTS

In the following embodiments, examples of preparing the phase shift blankmask and the photomask according to the disclosure will be described.

On the LTEM substrate, 40 pairs of Mo/Si layers were stacked to form the reflective film, and then the capping film was formed with ruthenium (Ru) to have a thickness of 2.5 nm. In the structure where the reflective film and the capping film were stacked, the reflectivity measured by an EUV reflectometer exhibited 64.57% with respect to the EUV light having a wavelength of 13.53 nm, a full width at half maximum (FWHM) exhibited 0.57 nm, and a center wavelength (CWL) exhibited 13.52 nm. Therefore, there were no problems of using this structure as the reflective film and the capping film.

Before forming the two-layered phase shift film, the first layer and the second layer of the phase shift film were individually formed and their refractive index (n) and extinction coefficient (k) were then measured with respect to the exposure light having a wavelength of 13.53 nm.

shift film was etched with fluorine-based gas through the resist film pattern. Subsequently, the first layer of the phase

TABLE 1

SPUTTERING CONDITIONS FOR PHASE SHIFT FILM, AND N AND K MEASURED UNDER CONDITIONS

|  |  | Sputtering Condition | | | | | Results@13.53 nm | |
|---|---|---|---|---|---|---|---|---|
|  |  | Target composition | Ar | $N_2$ | $O_2$ | Power [kW] | n | k |
| First layer of phase shift film | Embodiment 1 | CrNb[40:60] | 40 | 0 | — | 0.8 | 0.9436 | 0.0164 |
|  | Embodiment 2 |  | 28 | 12 | — | 0.8 | 0.9356 | 0.0203 |
|  | Embodiment 3 |  | 20 | 20 | — | 0.8 | 0.9316 | 0.0212 |
|  | Embodiment 4 |  | 20 | 20 | — | 2.0 | 0.9417 | 0.0178 |
|  | Embodiment 5 |  | 20 | 20 | 10 | 0.8 | 0.9522 | 0.0202 |
|  | Embodiment 6 |  | 20 | 20 | 15 | 0.8 | 0.9533 | 0.0197 |
|  | Embodiment 7 |  | 20 | 20 | 20 | 0.8 | 0.9543 | 0.0193 |
|  | Embodiment 8 | CrNb[45:55] | 20 | 20 | — | 0.8 | 0.9366 | 0.0191 |
|  | Embodiment 9 | CrNb[60:40] | 40 | — | — | 0.8 | 0.9403 | 0.0197 |
|  | Embodiment 10 |  | 28 | 12 | — | 0.8 | 0.9357 | 0.0212 |
|  | Embodiment 11 |  | 20 | 20 | — | 0.8 | 0.9376 | 0.0215 |
| Second layer of phase shift film | Embodiment 12 | TaB[9:1] | 15 | — | 100 | 0.6 | 0.9632 | 0.0360 |
|  | Embodiment 13 | TaB[9:1] | 15 | — | 50 | 0.8 | 0.9553 | 0.0382 |

Regarding some of the embodiments for the layers of the phase shift film formed under the conditions shown in the Table 1, their etching properties were evaluated using the ICP-Dry etcher. The evaluation results are shown in the following Table 2.

TABLE 2

ETCHING PROPERTIES OF MATERIALS FOR PHASE SHIFT FILM

|  | Etching Gas | | | Bias power | Etch-rate |
|---|---|---|---|---|---|
|  | $Cl_2$ | F | O2 | | |
| Embodiment 1 | o | X | X | <50 W | 2.8 Å/s |
| Embodiment 2 | o | X | X | <50 W | 4.3 Å/s |
| Embodiment 3 | o | X | X | <50 W | 5.8 Å/s |
| Embodiment 9 | o | X | X | <50 W | 2.5 Å/s |
| Embodiment 10 | o | X | X | <50 W | 3.8 Å/s |
| Embodiment 11 | o | X | X | <50 W | 4.2 Å/s |
| Embodiment 12 | X | o | X | <50 W | 2.8 Å/s |
| Embodiment 13 | X | o | X | <50 W | 2.9 Å/s |

Based on the measured n, k and etching properties of the phase shift film, the first layer and the second layer of the phase shift film were sequentially formed on the capping film. In this case, a film growth condition is based on the embodiment 3 and the embodiment 12, and the first layer and the second layer were grown as films to have a thickness of 50 nm and a thickness of 4 nm, respectively. The result of measuring the reflectivity of the phase shift film grown as above with respect to the DUV inspection light having a wavelength of 193 nm exhibited 33%, and it was confirmed that the contrast was high as compared with the reflectivity of 63% the stacked structure of the reflective film and the capping film has during the inspection using the DUV inspection light. Then, the resist film was finally coated on the phase shift film to a thickness of 100 nm, thereby completely preparing the phase shift blankmask.

Using the phase shift blankmask prepared as above, the photomask was prepared by the following processes. First, a resist film pattern was formed by e-beam writing and developing processes. Then, the second layer of the phase shift film was etched with fluorine-based gas through the resist film pattern. Subsequently, the first layer of the phase shift film was etched with chlorine-based gas to completely prepare the phase shift photomask. Then, the result of measuring the cross-sectional inclination of a phase shift film pattern exhibited 86°, and it was confirmed that an excellent pattern profile could be implemented.

Regarding the photomask prepared as above, wafer simulation was performed as follows. The simulation was carried out using a staggered contact hole pattern of 17 nm. As a result, the relative reflectivity of the phase shift film exhibited 10%, and the phase shift amount exhibited 199°. Further, NILS exhibited 1.95, and DtC exhibited 114.7 mJ.

COMPARATIVE EXAMPLE

In this comparative example, the process of preparing the blankmask with the phase shift film containing ruthenium (Ru) and the process of preparing the photomask using the prepared blankmask will be described.

First, the reflective film and the capping film were formed like those of the foregoing embodiment. Then, the etch stop film was formed having the two-layered structure including the layer of TaBN and the layer of TaBO, and the phase shift film containing only ruthenium (Ru) was formed on the etch stop film. Then, the hard mask film containing TaBO was formed on the phase shift film, and the resist film was lastly formed on the hard mask film, thereby finally completing the blankmask.

In the foregoing process, the phase shift film and the capping film contained the same material, and therefore the etch stop film was formed having the two-layered structure to minimize damage to the capping film when the etch stop film is etched. In other words, because a Ta-based material is highly likely to be oxidized and a material for etching the phase shift film containing Ru contains chlorine-based gas and oxygen, the layer of TaBN was first formed and then the layer of TaBO was then additionally formed to control an oxide film on the surface of TaBN.

Then, the phase shift film containing ruthenium (Ru) was formed on the etch stop film, and the hard mask film containing TaBO was additionally formed to improve the resolution and CD linearity.

This phase shift blankmask structure according to the comparative example additionally includes the etch stop film and the hard mask film and is more complicated than those of the foregoing embodiments.

The method of preparing the photomask through the phase shift blankmask is as follows.

First, the resist film pattern was formed through e-beam writing and developing processes like that of the foregoing embodiment. Then, the resist film pattern was used as the etch mask to form the hard mask film pattern of TaBO. In this case, fluorine (F)-based gas was used as the etching gas. Then, the resist film pattern was removed, and then the hard mask film pattern was used as the etch mask to etch the phase shift film with chlorine ($Cl_2$)-based gas and oxygen ($O_2$) gas. Then, fluorine (F)-based gas was used again to etch the upper layer of TaBO in the etch stop film. In this case, the hard mask film is removed. Then, chlorine ($Cl_2$)-based gas was used again without oxygen ($O_2$) to etch the lower layer of TaBN in the etch stop film, thereby finally completing the phase shift photomask.

Below, the characteristics of the blankmask according to the comparative example were measured as follows. First, the reflectivity of the phase shift film was measured with respect to the inspection light having a wavelength of 193 nm. As a result, the reflectivity exhibited 45.2%, which showed that the contrast was lowered as compared with that of the foregoing embodiment. This means that it is inappropriate to form the phase shift film only with ruthenium (Ru) and oxygen (O) is necessary in addition to ruthenium (Ru).

Then, the profile of the phase shift film pattern formed by the foregoing processes was measured. As a result, the cross-sectional inclination of the pattern exhibited 70°, and it was confirmed that the profile was poor as compared to that of the foregoing embodiment.

According to the disclosure, it is possible to implement the characteristics, i.e., high resolution and NILS required for a phase shift blankmask for the EUV during wafer printing, and implement a low DtC.

Further, according to the disclosure, the phase shift film is made of a material without containing ruthenium (Ru), and therefore does not cause the problem that occurs when containing ruthenium (Ru). Accordingly, a process for preparing the photomask is relatively simple, and a structure for requiring no etch stop film beneath the phase shift film improves a yield when preparing not only the blankmask but also the photomask.

Although details of the disclosure have been described above through a few embodiments of the disclosure with reference to the accompanying drawings, the embodiments are merely for the illustrative and descriptive purposes only but not construed as limiting the scope of the disclosure defined in the appended claims. It will be appreciated by a person having ordinary knowledge in the art that various changes and other equivalent embodiments may be made from these embodiments. Thus, the scope of the disclosure should be defined by the technical subject matters of the appended claims.

What is claimed is:

1. A blankmask for extreme ultraviolet (EUV) lithography, comprising a substrate, a reflective film formed on the substrate, a capping film formed on the reflective film, and a phase shift film formed on the capping film, the phase shift film comprising:
    a first layer formed on the capping film, containing chrome (Cr) and niobium (Nb) and further containing one or more of oxygen (O), nitrogen (N), and carbon (C), having a thickness of 30 to 60 nm, and having a refractive index (n) of 0.925 to 0.935 and an extinction coefficient (k) of 0.015 to 0.025 with respect to exposure light having a wavelength of 13.5 nm, and
    a second layer formed on the first layer and containing tantalum (Ta) and further containing one or more of oxygen (O), nitrogen (N), and carbon (C), having a thickness of 2 to 10 nm, and having a refractive index (n) of 0.940 to 0.960 and an extinction coefficient (k) of 0.025 to 0.035 with respect to exposure light having a wavelength of 13.5 nm.

2. The blankmask of claim 1, wherein content of niobium in the first layer ranges from 20 to 50 at %.

3. The blankmask of claim 1, wherein content of chrome (Cr) in the first layer ranges from 10 to 40 at %.

4. The blankmask of claim 1, wherein content of nitrogen (N) in the first layer ranges from 10 to 60 at %.

5. The blankmask of claim 1, wherein the first layer has a thickness of 80% or more of a total thickness of the phase shift film.

6. The blankmask of claim 1, wherein content of tantalum (Ta) in the second layer is higher than or equal to 50 at %.

7. The blankmask of claim 6, wherein the second layer further contains boron (B).

8. The blankmask of claim 7, wherein content of boron (B) in the second layer ranges from 5 to 20 at %.

9. The blankmask of claim 6, wherein the second layer has a surface reflectivity of 40% or lower to inspection light having a wavelength of 193 nm.

10. The blankmask of claim 1, wherein the phase shift film has a relative reflectivity of 6 to 15% to the reflective film with respect to exposure light having a wavelength of 13.5 nm.

11. A photomask prepared using the blankmask for extreme ultraviolet (EUV) lithography of claim 1.

* * * * *